United States Patent [19]
Barre

[11] Patent Number: 5,172,015
[45] Date of Patent: Dec. 15, 1992

[54] INTEGRATABLE TRANSISTOR CIRCUIT FOR OUTPUTTING LOGICAL LEVELS

[75] Inventor: Claude Barre, München, Fed. Rep. of Germany

[73] Assignee: Siemens Aktiengesellschaft, Munich, Fed. Rep. of Germany

[21] Appl. No.: 665,782

[22] Filed: Mar. 7, 1991

[30] Foreign Application Priority Data
Mar. 7, 1990 [DE] Fed. Rep. of Germany ....... 4007212

[51] Int. Cl.$^5$ .................. H03K 19/0175; H03K 19/02
[52] U.S. Cl. .................................... 307/475; 307/455; 307/446; 307/570
[58] Field of Search ................ 307/475, 455, 446, 570

[56] References Cited

U.S. PATENT DOCUMENTS

| | | | |
|---|---|---|---|
| 4,680,480 | 7/1987 | Hopta | 307/270 |
| 4,745,304 | 5/1988 | Wilson | 307/455 |
| 4,897,613 | 1/1990 | Rao et al. | 330/253 |
| 4,968,904 | 11/1990 | Yamashita et al. | 307/475 |
| 5,006,731 | 4/1991 | Denda | 307/455 |
| 5,030,856 | 7/1991 | Dansky et al. | 307/446 |

FOREIGN PATENT DOCUMENTS 3245495 7/1983 Fed. Rep. of Germany .
3339498 7/1987 Fed. Rep. of Germany .

Primary Examiner—Edward P. Westin
Assistant Examiner—Andrew Sanders
Attorney, Agent, or Firm—Herbert L. Lerner; Laurence A. Greenberg

[57] ABSTRACT

An integratable transistor circuit for outputting logical levels includes a switch stage, a switch stage output current amplifier associated with the switch stage, and a level monitoring circuit associated with the switch stage. The switch stage at least includes at least one transistor serving as a switch element and having a primary current path and a control input serving as a switch stage input. At least one resistor is connected to the primary current path of the at least one transistor at a coupling point serving as a switch stage output. The at least one resistor and the primary current path of the at least one transistor form a series circuit having a first end with the at least one resistor connected to a first supply voltage and a second end connected to a second supply voltage. The level monitoring circuit includes at least one control input receiving a reference voltage for determining a switch stage output level. The level monitoring circuit is connected to the switch stage output for influencing logical levels at the switch stage output, and the level monitoring circuit is connected to at least one of the two supply voltages.

10 Claims, 3 Drawing Sheets

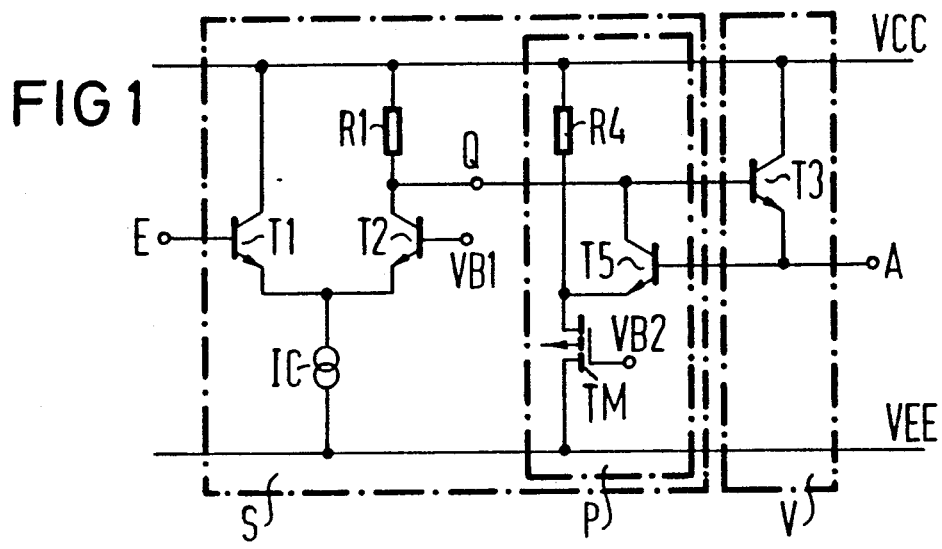
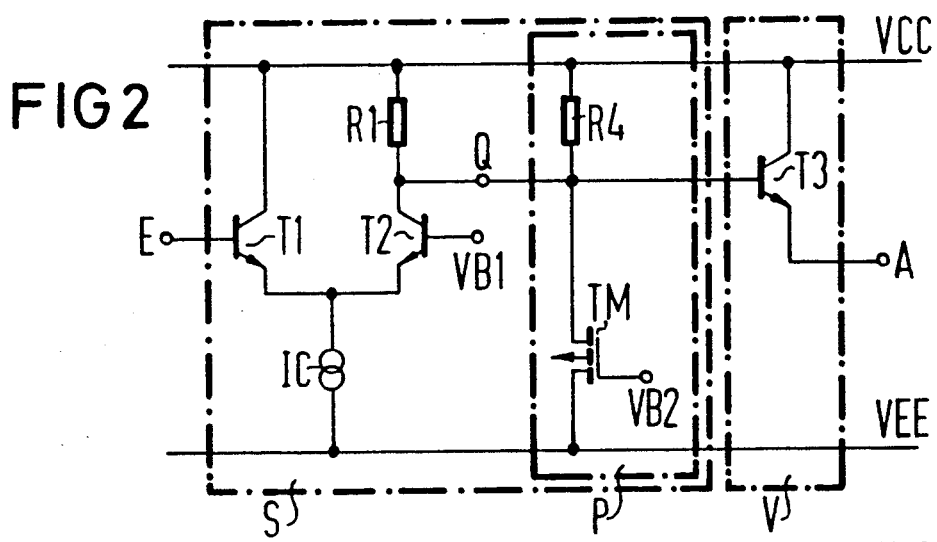
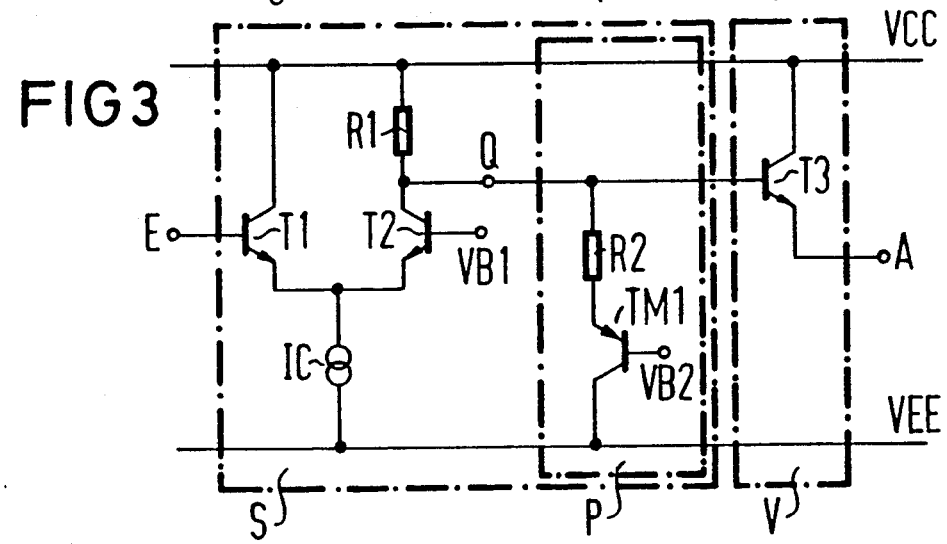

INTEGRATABLE TRANSISTOR CIRCUIT FOR OUTPUTTING LOGICAL LEVELS

The invention relates to an integratable transistor circuit for outputting logical levels, including a switch stage and a switch stage output current amplifier, the switch stage at least including a series circuit of at least one resistor having one end connected to a supply voltage and the primary current path of at least one transistor serving as a switch element, the resistor and the transistor being interconnected at a coupling point serving as a switch stage output, the control input of the transistor serving as a switch stage input, and the other end of the series circuit being connected to a second supply voltage.

The outputs of switch stages as defined above output a high or low voltage level, representing a particular logic state, to units connected to the output side of the switch stage. Such logical voltage levels are generated due to the fact that in the series circuit of the resistor and the primary current path of the transistor (collector-to-emitter path of a bipolar transistor, or drain-to-source path of an MOS transistor) current either flows, or no current flows. If no current is flowing, then no voltage drop occurs at the resistor, and the supply voltage, to which the resistor is directly connected, is present at the switch stage output. In contrast, if current does flow, then the voltage drop at the resistor depends on its resistance and on the current intensity through the resistor.

The absolute values of the logical voltage levels are defined within certain limits for each known logic family. The allowable absolute tolerance of the absolute logic voltage level is dependent on the absolute value of the voltage difference between two logic states, which is referred to below as the "rise". With a small rise, the absolute tolerances are accordingly smaller, and the influences of fluctuating supply voltages, fluctuations in the output load current, and the effects of temperature are thus increasingly critical. An attempt is also made to keep current consumption in integratable transistor circuits low. In order to attain a certain rise, an attempt is made to achieve it by means of a low current intensity in the resistor. However, a larger resistor worsens the conditions for adhering to the output voltage level.

It is accordingly an object of the invention to provide an integratable transistor circuit for outputting logical levels, which overcomes the hereinafore-mentioned disadvantages of the heretofore-known devices of this general type and which reduces to a minimum the dependence on external influences of the logical output voltage levels of integrated transistor circuits.

With the foregoing and other objects in view there is provided, in accordance with the invention, an integratable transistor circuit for outputting logical levels, comprising a switch stage; a switch stage output current amplifier associated with the switch stage; the switch stage at least including at least one transistor serving as a switch element and having a primary current path and a control input serving as a switch stage input, and at least one resistor connected to the primary current path of the at least one transistor at a coupling point serving as a switch stage output, the at least one resistor and the primary current path of the at least one transistor forming a series circuit having a first end with the at least one resistor connected to a first supply voltage and a second end connected to a second supply voltage; and a level monitoring circuit associated with the switch stage, the level monitoring circuit including at least one control input receiving a reference voltage for determining a switch stage output level, the level monitoring circuit being connected to the switch stage output for influencing logical levels at the switch stage output, and the level monitoring circuit being connected to at least one of the two supply voltages.

Due to the inclusion of the level monitoring circuit, the output levels of the switch stage are independent of external influences over wide ranges. The absolute value of an output level in each case is determined by a reference voltage. If both logical levels are to be monitored, then two reference voltages are necessary for this, but if only one level is monitored, only one reference voltage is needed.

The current intensity in the switch stage can be lowered to a minimum, and the resistance can be increased accordingly, in order to attain the necessary rise. The resultant saving of power that becomes possible in the switching stage is much greater than the additional power needed for the level monitoring circuit.

In accordance with another feature of the invention, the switch stage includes a first npn bipolar transistor and the at least one transistor in the form of a second npn bipolar transistor; the first and second npn bipolar transistors have base, collector and emitter terminals; the emitter terminals of the first and second npn bipolar transistors are interconnected to form a differential switch; the base terminal of the first npn bipolar transistor forms the switch stage input; the collector terminal of the first npn bipolar transistor is connected directly to the first supply voltage; the collector terminal of the second npn bipolar transistor forms the switch stage output and is connected through the at least one resistor to the first supply voltage; a current source connected to the emitter terminals of the first and second npn bipolar transistors and supplied by the second supply voltage; and the switch stage output current amplifier includes a third npn bipolar transistor in an emitter follower circuit having a collector terminal connected to the first supply voltage and a base terminal connected to the collector terminal of the second npn bipolar transistor.

Such a structure attains particular significance. Aside from the level monitoring circuit, such a structure calls for an integratable transistor circuit, which is equivalent to an emitter coupled logic (ECL) switch stage and in this mode is used as an output circuit. The logic signals output by an output circuit pass to an input circuit through lines, for example through conductor tracks on a printed circuit board. In order for the crosstalk from one conductor track to another to be limited to a minimum, the steepness of the edges of the signals output by the output circuit is reduced. An associated increased transit time in the output circuit is acceptable in return, since with an increase in the total transit time, from the input circuit through the actual logic to the output circuit, of 5 to 10%, there is a reduction in crosstalk from one line to other lines to half the value. In known output circuits, the reduction in edge steepness is attained by including a capacitance, for example in the form of an increased input capacitance of the npn bipolar transistor serving as the switch stage output current amplifier, between the switch stage output and a supply voltage. The resistor of the switch stage and the capacitor incorporated at the switch stage output act as a delay element, with a time constant $\tau = R \cdot C$. A large value of the time constant τ can accordingly also be attained by increasing the resistance. However, increasing the resistance cannot be suitably exploited except through the association of the level monitoring circuit according to the invention with the switch stage, and thus adding a power reduction effect to the method of edge steepness reduction.

In accordance with a further feature of the invention, the level monitoring circuit includes a PMOS transistor having drain terminal connected to the second supply voltage, a source terminal connected to the switch stage output, and a gate terminal forming the at least one control input.

In accordance with an added feature of the invention, the level monitoring circuit includes a series circuit of a pnp bipolar transistor having emitter, collector and base terminals and another resistor having first and second terminals; the first terminal of the other resistor is connected to the emitter terminal of the pnp bipolar transistor; the second terminal of the other resistor is connected to the switch stage output; the collector terminal of the pnp bipolar transistor is connected to the second supply voltage; and the base terminal of the pnp bipolar transistor forms the at least one control input.

In accordance with an additional feature of the invention, there is provided a further resistor connected between the drain terminal of the PMOS transistor and the second supply voltage; and a further npn bipolar transistor having a base terminal connected to the drain terminal of the PMOS transistor, a collector terminal connected to the switch stage output, and an emitter terminal connected to the second supply voltage.

In accordance with yet another feature of the invention, the terminals of the level monitoring circuit (the source terminal of the PMOS transistor, or the second terminal of the other resistor or the collector terminal of the further npn bipolar transistor) connected to the switch stage output are interconnected to form a monitoring terminal, and the level monitoring circuit may include an additional resistor having one end connected to the monitoring terminal and another end connected to the first supply voltage.

In accordance with yet a further feature of the invention, there is provided an additional npn bipolar transistor having a collector-to-emitter path inserted between the monitoring terminal and the switch stage output and an emitter terminal connected to the monitoring terminal.

In accordance with yet an added feature of the invention, the additional npn bipolar transistor has a base terminal connected to the emitter terminal of the third npn bipolar transistor.

In accordance with yet an additional feature of the invention, the additional npn bipolar transistor has a base terminal connected to the switch stage output.

In accordance with again another feature of the invention, the at least one transistor is an MOS transistor having a base terminal and drain and source terminals defining a drain-to-source path; the series circuit in the switch stage includes the at least one resistor and the drain-to-source path of the MOS transistor; the gate terminal of the MOS transistor forms the switch stage input; the drain terminal of the MOS transistor is connected to the second supply voltage; and the switch stage output current amplifier includes an npn bipolar transistor in an emitter follower circuit having a collector terminal connected to the first supply voltage and a base terminal connected to the switch stage output.

In accordance with a concomitant feature of the invention, the level monitoring circuit includes another npn bipolar transistor having a collector terminal connected to the first supply voltage, an emitter terminal connected to the switch stage output, and a base terminal forming the at least one control input.

This embodiment of the switch stage makes it possible to convert voltage levels that are present at its input, such as levels that are conventional in CMOS technology, into voltage levels that are conventional in the ECL mode toward the circuit output. However, it is only with the use of the level monitoring circuit according to the invention that this circuit embodiment can be suitably exploited.

Other features which are considered as characteristic for the invention are set forth in the appended claims.

Although the invention is illustrated and described herein as embodied in an integratable transistor circuit for outputting logical levels, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic circuit diagram of an ECL output circuit with monitoring of the high level;

FIG. 2 is a diagram of the circuit of FIG. 1, but without a transistor between the monitoring terminal and the switch stage output;

FIG. 3 is a diagram of the circuit of FIG. 1, in which the level monitoring circuit is connected to only one supply voltage, and the MOS transistor is replaced with a pnp bipolar transistor;

Figure 4:
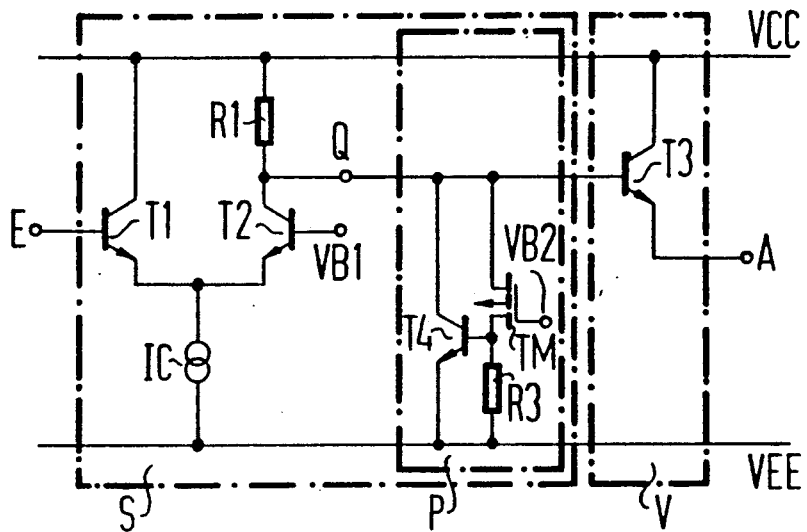
FIG. 4 is a diagram of the circuit of FIG. 3, in which the properties of the MOS transistor are reinforced with an npn transistor.

Referring now to the figures of the drawing in detail and first, particularly, to FIG. 1 thereof, there is seen a circuit diagram of an ECL output circuit, which includes a switch stage S containing a level monitoring circuit P, and a switch stage output current amplifier V connected to the output side of the switch stage S. A first npn bipolar transistor T1 and a second npn bipolar transistor T2 form a differential switch. The base terminal of the first npn bipolar transistor T1 forms a switch stage input E, while the collector terminal thereof is connected to a first supply voltage VCC. A resistor R1 has a first terminal connected to this first supply voltage VCC and a second terminal connected to the collector terminal of the second npn bipolar transistor T2. The connection point between the second terminal of the resistor R1 and the collector terminal of the second npn bipolar transistor T2 is used as a switch stage output Q. The emitter terminals of the two npn bipolar transistors T1, T2 are connected to a second supply voltage VEE through a constant current source IC. The switch threshold of the differential switch is defined by a reference voltage VB1, which is applied to the base terminal of the second npn bipolar transistor T2. The switch stage output Q acts directly upon the base terminal of a third npn bipolar transistor T3, which is used as the switch stage output current amplifier V. The collector terminal of this third npn bipolar transistor T3 is connected to the first supply voltage VCC, while the emitter terminal thereof serves as an output A of the entire circuit.

Figure 5:
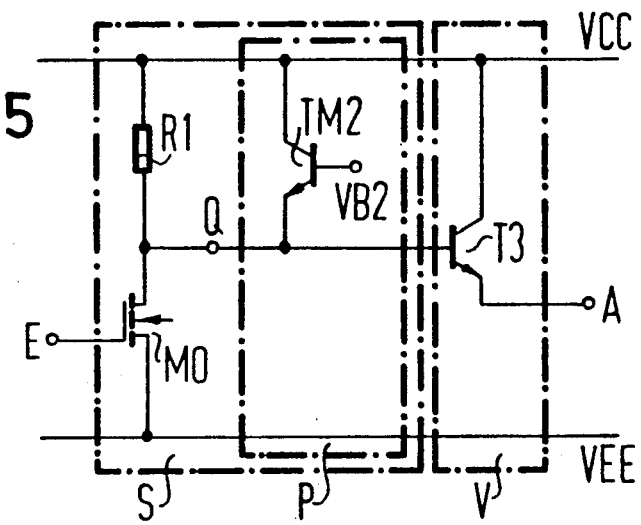
FIG. 5 is a diagram of a logic converter circuit with low level monitoring.

Since the circuit elements described thus far and the mutual connections thereof are applicable to all of the drawing figures except for FIG. 5, the following description will refer only to the level monitoring circuits P that differ from one another and are shown in the various drawing figures.

Figure 7:
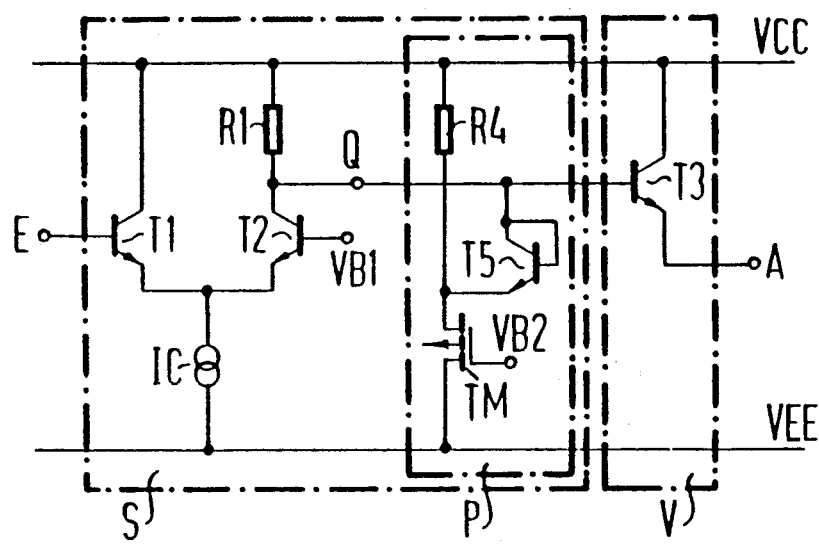
FIG. 7 is a diagram of another embodiment of the device.

The level monitoring circuit P shown in FIG. 1 has a PMOS transistor TM with a drain terminal which is connected to the second supply voltage VEE and a gate terminal to which a second reference voltage VB2 is applied for defining the output high level. The source terminal of the PMOS transistor TM is connected to the emitter terminal of a fifth or additional npn bipolar transistor T5 and to the first terminal of a fourth or additional resistor R4 having a second terminal which is connected to the first supply voltage VCC. The base terminal of the fifth npn bipolar transistor T5 is connected to the emitter terminal of the third npn bipolar transistor T3, in order to monitor the voltage at the output A of the entire circuit, while the collector terminal of the fifth npn bipolar transistor T5 is connected to the switch stage output Q. A lowering of the voltage at the output A of the entire circuit as compared with the second reference voltage VB2 effects an increased voltage drop in the collector-to-emitter path of the fifth npn bipolar transistor T5 and thus an increase in the voltage at the switch stage output Q, which increase is passed on to the output A of the entire circuit through the third npn bipolar transistor. Accordingly, this circuit acts like a closed control loop having a set-point variable, which is the voltage level at the switch stage output Q, that is determined by the second reference voltage VB2. Through the use of the fourth resistor R4, the operating point of the level monitoring circuit P is defined in such a way that the control range is as wide as possible. As shown in FIG. 7 the fith bipolar transistor T5 can be connected as diode.

The level monitoring circuit P shown in FIG. 2 likewise has the fourth resistor R4 and the PMOS transistor TM, with the second reference voltage VB2 applied thereto. However, in contrast to FIG. 1 the fifth npn bipolar transistor T5 is omitted. The connecting point between the source terminal of the PMOS transistor TM and the fourth resistor R4, which can also be referred to as the monitoring terminal, is then connected directly to the switch stage output Q.

The level monitoring circuit P in FIG. 3 includes a pnp bipolar transistor TM1 and a second or other resistor R2. The second terminal of the second resistor R2 is connected directly to the switch stage output Q. Connected to the first terminal of the second resistor R2 is the emitter terminal of the pnp bipolar transistor TM1. The second reference voltage VB2 controls the base of the pnp bipolar transistor TM1 and the collector terminal thereof is connected to the second supply voltage VEE.

The level monitoring circuit P of FIG. 4 includes the PMOS transistor TM, a third or further resistor R3 and a fourth or further npn bipolar transistor T4. The emitter terminal of the npn bipolar transistor T4 and the first terminal of the third resistor R3 are connected to the second supply voltage VEE. The drain terminal of the PMOS transistor TM, the base terminal of the fourth npn bipolar transistor T4 and the second terminal of the third resistor R3 are connected to one another. The second reference voltage VB2 is applied to the gate terminal of the PMOS transistor TM. The collector terminal of the npn bipolar transistor T4 and the source terminal of the PMOS transistor TM are combined into one monitoring terminal and connected to the switch stage output Q. This advantage of this embodiment over a single PMOS transistor between the switch stage output Q and the second supply voltage VEE, is that the relatively high parasitic capacitance dictated by the geometric layout of the PMOS transistor is operative only with a high voltage potential at the circuit output Q. A PMOS transistor with enhanced properties can be achieved in a smaller space than a single PMOS transistor, so that its parasitic capacitance is comparatively low, if it is not amplified by a transistor connected to its output side. The fourth npn bipolar transistor T4 serves to enhance the properties of the PMOS transistor. If the voltage conditions necessary for an enhancement are not present, for instance if there is a low level at the circuit output Q, then the properties of the PMOS transistor TM are not enhanced. As a result, the possibly interfering capacitance of the level monitoring circuit P upon a change from low to high at the switch stage output Q, may not be operative.

Figure 6:
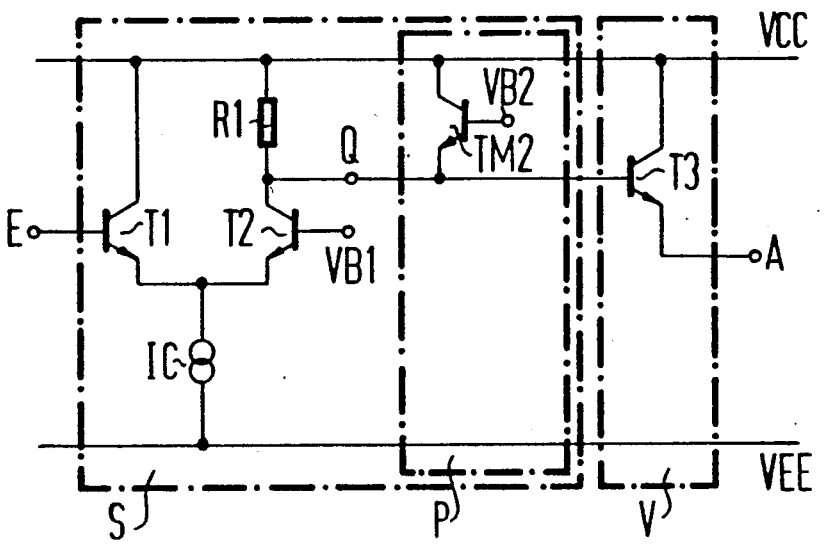
FIG. 6 is a diagram of an ECL output circuit with low level monitoring.

The level monitoring circuit P in FIG. 6 monitors the low voltage level at the circuit output Q. The circuit P includes a sixth or other npn bipolar transistor TM2 having a base terminal serving as a control input, to which the second reference voltage VB2 is applied, and a collector terminal which is connected to the first supply voltage VCC. The emitter terminal of the sixth npn bipolar transistor TM2 is connected to the switch stage output Q. With this kind of closed-loop control of the low voltage level at the switch stage output Q, less accuracy of the current source IC is necessary than without low voltage level monitoring.

FIG. 5 shows a circuit for converting digital CMOS input voltage levels into digital ECL output voltage levels. This circuit includes a switch stage S, a switch stage output current amplifier V, and a level monitoring circuit P associated with the switch stage. The switch stage S includes a series circuit of the first resistor R1 and an NMOS transistor M0. The first terminal of the resistor R1 is connected to the first supply voltage VCC, while the second terminal thereof is connected to the source terminal of the NMOS transistor M0 and serves as a switch stage output Q. The drain terminal of the NMOS transistor M0 is connected to the second supply voltage VEE and the gate terminal thereof which serves as the switch stage input E, is controlled by digital input signals with typical voltage levels for CMOS technology. The output current is amplified by the third npn bipolar transistor T3. The collector terminal of the third npn bipolar transistor T3 is connected to the first supply voltage VCC, the base terminal thereof is connected to the switch stage output Q, and the emitter terminal of the third npn bipolar transistor T3 serves as the output A of the entire circuit. The ECL low voltage level at the switch stage output Q is monitored by the sixth npn bipolar transistor TM2. The collector terminal of the sixth npn bipolar transistor TM2 is connected to the first supply voltage VCC, and the emitter terminal thereof is connected to the switch stage output Q. The base terminal of the sixth npn bipolar transistor TM2 serves as a control input, at which the second reference voltage VB2 for determining the output low level is present.

I claim:

1. An integratable transistor circuit for outputting logical levels, comprising a switch stage; a switch stage output current amplifier associated with said switch stage; said switch stage at least including at least one transistor serving as a switch element and having a primary current path and a control input serving as a switch stage input, and at least one resistor connected to the primary current path of said at least one transistor at a coupling point serving as a switch stage output, said at least one resistor and the primary current path of said at least one transistor forming a series circuit having a first end with said at least one resistor connected to a first supply voltage and a second end connected to a second supply voltage; and a level monitoring circuit associated with said switch stage, said level monitoring circuit including at least one control input receiving a reference voltage for determining a switch stage output level, said level monitoring circuit being connected to said switch stage output for influencing logical levels at said switch stage output, and said level monitoring circuit being connected to at least one of the two supply voltages, said level monitoring circuit including a PMOS transistor having a drain terminal connected to the second supply voltage, a source terminal connected to said switch stage output, and a gate terminal forming said at least one control input, wherein said switch stage includes a first npn bipolar transistor and said at least one transistor in the form of a second npn bipolar transistor; said first and second npn bipolar transistors have base, collector and emitter terminals; the emitter terminals of said first and second npn bipolar transistors are interconnected to form a differential switch; the base terminal of said first npn bipolar transistor forms said switch stage input; the collector terminal of said first npn bipolar transistor is connected directly to the first supply voltage; the collector terminal of said second npn bipolar transistor forms said switch stage output and is connected through said at least one resistor to the first supply voltage; a current source connected to the emitter terminals of said first and second npn bipolar transistors and supplied by the second supply voltage; and said switch stage output current amplifier includes a third npn bipolar transistor in an emitter follower circuit having a collector terminal connected to the first supply voltage and a base terminal connected to the collector terminal of said second npn bipolar transistor.

2. An integratable transistor circuit for outputting logical levels, comprising a switch stage; a switch stage output current amplifier associated with said switch stage; said switch stage at least including at least one transistor serving as a switch element and having a primary current path and a control input serving as a switch stage input, and at least one resistor connected to the primary current path of said at least one transistor at a coupling point serving as a switch stage output, said at least one resistor and the primary current path of said at least one transistor forming a series circuit having a first end with said at least one resistor connected to a first supply voltage and a second end connected to a second supply voltage; and a level monitoring circuit associated with said switch stage, said level monitoring circuit including at least one control input receiving a reference voltage for determining a switch stage output level, said level monitoring circuit being connected to said switch stage output for influencing logical levels at said switch stage output, and said level monitoring circuit being connected to at least one of the two supply voltages, said level monitoring circuit including a series circuit of a pnp bipolar transistor having emitter, collector and base terminals and another resistor having first and second terminals; the first terminal of the other resistor being connected to the emitter terminal of said pnp bipolar transistor; the second terminal of said other resistor being connected to said switch stage output; the collector terminal of said pnp bipolar transistor being connected to the second supply voltage; and the base terminal of said pnp bipolar transistor forming said at least one control input.

3. An integratable transistor circuit for outputting logical levels, comprising a switch stage; a switch stage output current amplifier associated with said switch stage; said switch stage at least including at least one transistor serving as a switch element and having a primary current path and a control input serving as a switch stage input, and at least one resistor connected to the primary current path of said at least one transistor at a coupling point serving as a switch stage output, said at least one resistor and the primary current path of said at least one transistor forming a series circuit having a first end with said at least one resistor connected to a first supply voltage and a second end connected to a second supply voltage; and a level monitoring circuit associated with said switch stage, said level monitoring circuit including at least one control input receiving a reference voltage for determining a switch stage output level, said level monitoring circuit being connected to said switch stage output for influencing logical levels at said switch stage output, and said level monitoring circuit being connected to at least one of the two supply voltages, said level monitoring circuit including a PMOS transistor having a drain terminal connected to the second supply voltage, a source terminal connected to said switch stage output, a gate terminal forming said at least one control input, a further resistor connected between the drain terminal of said PMOS transistor and the second supply voltage; and an npn bipolar transistor having a base terminal connected to the drain terminal of said PMOS transistor, a collector terminal connected to said switch stage output, and an emitter terminal connected to the second supply voltage.

4. An integratable transistor circuit for outputting logical levels, comprising a switch stage; a switch stage output current amplifier associated with said switch stage; said switch stage at least including at least one transistor serving as a switch element and having a primary current path and a control input serving as a switch stage input, and at least one resistor connected to the primary current path of said at least one transistor at a coupling point serving as a switch stage output, said at least one resistor and the primary current path of said at least one transistor forming a series circuit having a first end with said at least one resistor connected to a first supply voltage and a second end connected to a second supply voltage; and a level monitoring circuit associated with said switch stage, said level monitoring circuit including at least one control input receiving a reference voltage for determining a switch stage output level, said level monitoring circuit being connected to said switch stage output for influencing logical levels at said switch stage output, and said level monitoring circuit being connected to at least one of the two supply voltages, said at least one transistor being an MOS transistor having a base terminal and drain and source terminals defining a drain-to-source path; said series circuit in said switch stage including said at least one resistor and the drain-to-source path of said MOS transistor; the gate terminal of said MOS transistor forming said switch stage input; the drain terminal of said MOS transistor being connected to the second supply voltage; and said switch stage output current amplifier including an npn bipolar transistor in an emitter follower circuit having a collector terminal connected to the first supply voltage and a base terminal connected to said switch stage output.

5. An integratable transistor circuit for outputting logical levels, comprising a switch stage; a switch stage output current amplifier associated with said switch stage; said switch stage at least including at least one transistor serving as a switch element and having a primary current path and a control input serving as a switch stage input, and at least one resistor connected to the primary current path of said at least one transistor at a coupling point serving as a switch stage output, said at least one resistor and the primary current path of said at least one transistor forming a series circuit having a first end with said at least one resistor connected to a first supply voltage and a second end connected to a second supply voltage; and a level monitoring circuit associated with said switch stage, said level monitoring circuit including at least one control input receiving a reference voltage for determining a switch stage output level, said level monitoring circuit being connected to said switch stage output for influencing logical levels at said switch stage output, and said level monitoring circuit being connected to at least one of the two supply voltages; said level monitoring circuit including a PMOS transistor having a drain terminal connected to the second supply voltage, a source terminal and a gate terminal forming said at least one control input, an additional resistor having one terminal connected to said source terminal of said PMOS transistor and another terminal connected to the first supply voltage, a npn bipolar transistor having a collector-to-emitter path inserted between the source terminal of said PMOS transistor and said switch stage output and an emitter terminal connected to the source terminal of said PMOS transistor.

6. The integratable circuit according to claim 5, wherein said switch stage includes a first npn bipolar transistor and said at least one transistor in the form of a second npn bipolar transistor; said first and second npn bipolar transistors have base, collector and emitter terminals; the emitter terminals of said first and second npn bipolar transistors are interconnected to form a differential switch; the base terminal of said first npn bipolar transistor forms said switch stage input; the collector terminal of said first npn bipolar transistor is connected directly to the first supply voltage; the collector terminal of said second npn bipolar transistor forms said switch stage output and is connected through said at least one resistor to the first supply voltage; a current source connected to the emitter terminals of said first and second npn bipolar transistors and supplied by the second supply voltage; and said switch stage output current amplifier includes a third npn bipolar transistor in an emitter follower circuit having a collector terminal connected to the first supply voltage and a base terminal connected to the collector terminal of said second npn bipolar transistor.

7. The integratable circuit according to claim 6, wherein said npn bipolar transistor of said level monitoring circuit has a base terminal connected to the emitter terminal of said third npn bipolar transistor.

8. The integratable circuit according to claim 6, wherein said additional npn bipolar transistor has a base terminal connected to said switch stage output.

9. The integratable circuit according to claim 2, wherein said switch stage includes a first npn bipolar transistor and said at least one transistor in the form of a second npn bipolar transistor; said first and second npn bipolar transistors have base, collector and emitter terminals; the emitter terminals of said first and second npn bipolar transistors are interconnected to form a differential switch; the base terminal of said first npn bipolar transistor forms said switch stage input; the collector terminal of said first npn bipolar transistor is connected directly to the first supply voltage; the collector terminal of said second npn bipolar transistor forms said switch stage output and is connected through said at least one resistor to the first supply voltage; a current source connected to the emitter terminals of said first and second npn bipolar transistors and supplied by the second supply voltage; and said switch stage output current amplifier includes a third npn bipolar transistor in an emitter follower circuit having a collector terminal connected to the first supply voltage and a base terminal connected to the collector terminal of said second npn bipolar transistor.

10. The integratable circuit according to claim 4, wherein said level monitoring circuit includes an another npn bipolar transistor having a collector terminal connected to the first supply voltage, an emitter terminal connected to said switch stage output, and a base terminal forming said at least one control input.

* * * * *